United States Patent
Shiga

(10) Patent No.: US 6,982,904 B2
(45) Date of Patent: Jan. 3, 2006

(54) NON-VOLATILE SEMICONDUCTOR MEMORY DEVICE AND ELECTRIC DEVICE WITH THE SAME

(75) Inventor: Hitoshi Shiga, Matsuyama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 9 days.

(21) Appl. No.: 10/856,851

(22) Filed: Jun. 1, 2004

(65) Prior Publication Data

US 2005/0146959 A1    Jul. 7, 2005

(30) Foreign Application Priority Data

Jan. 7, 2004  (JP) .............................. 2004-002041

(51) Int. Cl.
*G11C 16/06*    (2006.01)

(52) U.S. Cl. ............................. 365/185.09; 365/185.21

(58) Field of Classification Search ................ 365/205, 365/185.09, 185.24, 185.21

See application file for complete search history.

(56) References Cited

U.S. PATENT DOCUMENTS 6,304,489 B1 * 10/2001 Iwahashi ............... 365/185.24
6,781,904 B2 *  8/2004 Lee et al. .................... 365/207

FOREIGN PATENT DOCUMENTS

JP    8-279295    10/1996

* cited by examiner

*Primary Examiner*—Richard Elms
*Assistant Examiner*—Hien Nguyen
(74) *Attorney, Agent, or Firm*—Oblon, Spivak, McClelland, Maier & Neustadt, P.C.

(57) ABSTRACT

A non-volatile semiconductor memory device includes: a cell array having electrically rewritable and non-volatile memory cells arranged therein; and a sense amplifier circuit configured to detect voltage change of a bit line in the cell array, thereby reading data of a selected memory cell coupled to the bit line, wherein the sense amplifier circuit is controlled to read data at plural timings within a period in which the bit line voltage is changing in correspondence with the selected memory cell, and compare data read out by successive two data read operations with each other so as to judge a threshold margin of the selected memory cell.

16 Claims, 13 Drawing Sheets

FIG. 9                    Data "0"→"0"
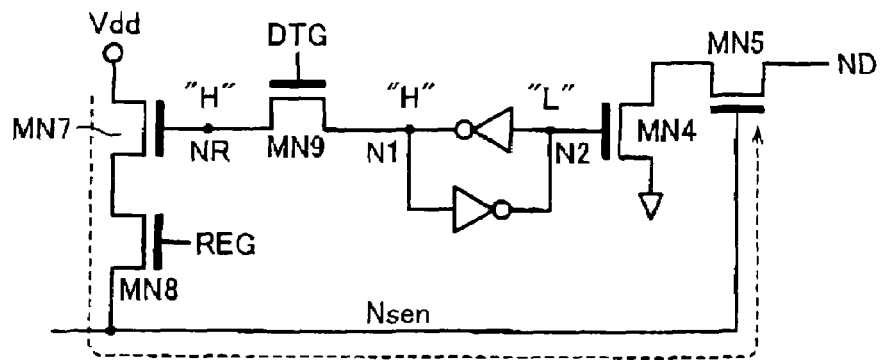
FIG. 10                   Data "0"→"1"
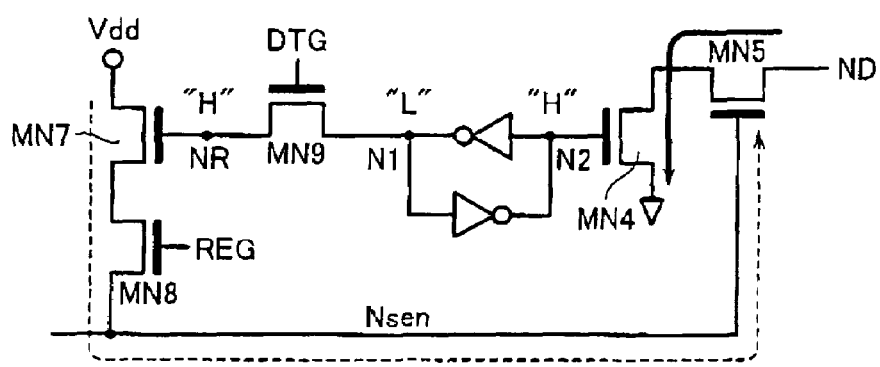
FIG. 11                   Data "1"→"1"
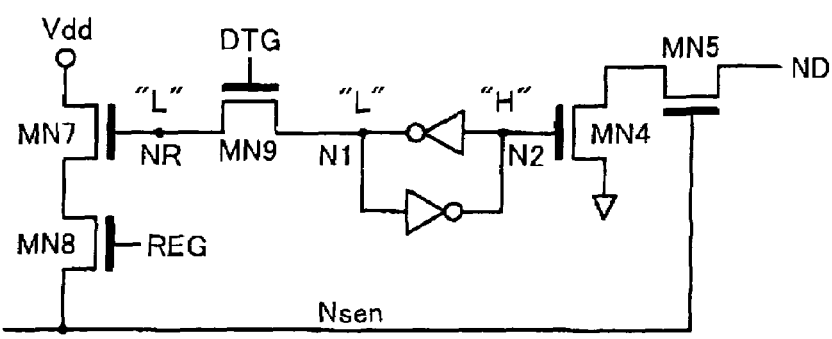

NON-VOLATILE SEMICONDUCTOR MEMORY DEVICE AND ELECTRIC DEVICE WITH THE SAME

CROSS-REFERENCE TO RELATED APPLICATION

This application is based on and claims the benefit of priority from the prior Japanese Patent Application No. 2004-2041, filed on Jan. 7, 2004, the entire contents of which are incorporated herein by reference.

BACKGROUND OF THE INVENTION

1. Field of the Invention

This invention relates to a non-volatile semiconductor memory device (EEPROM) and an electric device with the same.

2. Description of Related Art

In a conventional NAND-type flash memory, one block serves as a unit of data erasure, and one page as a unit of data read and write. Here, one block is defined as a group of NAND cell units with a shared word line, and one page is defined as a group of memory cells arranged along a word line.

In the NAND flash memory, to over-write data into a block, it is necessary to do write operations by a page after having erased the block. Therefore, in case it is required to rewrite a part of the block data, it is necessary to copy to-be-restored page data into another block (i.e., spare block), which has already been erased. This data copy is performed by repeating a page copy with reading data by a page and writing the read data into another block by a page (for example, refer to Japanese Patent Application Laid Open. No. 2003-233992).

However, repeating the above-described page copy, dada bits of the non-selected cells are disturbed in each read and write operation, thereby being likely to be inverted partially. To deal with the problem, it is required to prepare an ECC circuit for error checking and correcting the read data at each page copy reading time.

In detail, it is assumed that one page of a NAND-type flash memory is constituted by a normal data area of 2 KByte, and a redundant area of 64 Byte where various management data Including ECC data are stored. Data read in the page copy is performed by a page from the cell array to the page buffer, and data output of the read data is performed by serial transferring by a byte from the page buffer to the I/O terminals. Therefore, it is required to repeat the data output operation, error-checking, error-correcting and data write back into the page buffer 2112 times for one page copy operation. If the frequency of error appearance is not high, the error checking and correcting in the page copy will become a waste of time.

SUMMARY OF THE INVENTION

According to an aspect of the present invention, there is provided a non-volatile semiconductor memory device including:

a cell array having electrically rewritable and non-volatile memory cells arranged therein; and a sense amplifier circuit configured to detect voltage change of a bit line in the cell array, thereby reading data of a selected memory cell coupled to the bit line, wherein the sense amplifier circuit is controlled to read data at plural timings within a period in which the bit line voltage is changing in correspondence with the selected memory cell, and compare data read out by successive two data read operations with each other so as to Judge a threshold margin of the selected memory cell.

BRIEF DESCRIPTION OF THE DRAWINGS

FIG. 9 is a diagram for explanation of threshold judging by the sense unit of the flash memory.

FIG. 10 is a diagram for explanation of threshold judging by the sense unit of the flash memory.

FIG. 11 is a diagram for explanation of threshold judging by the sense unit of the flash memory.

DETAILED DESCRIPTION OF THE EMBODIMENTS

Illustrative embodiments of this invention will be explained with reference to the accompanying drawings below.

[Embodiment 1]

Figure 1:
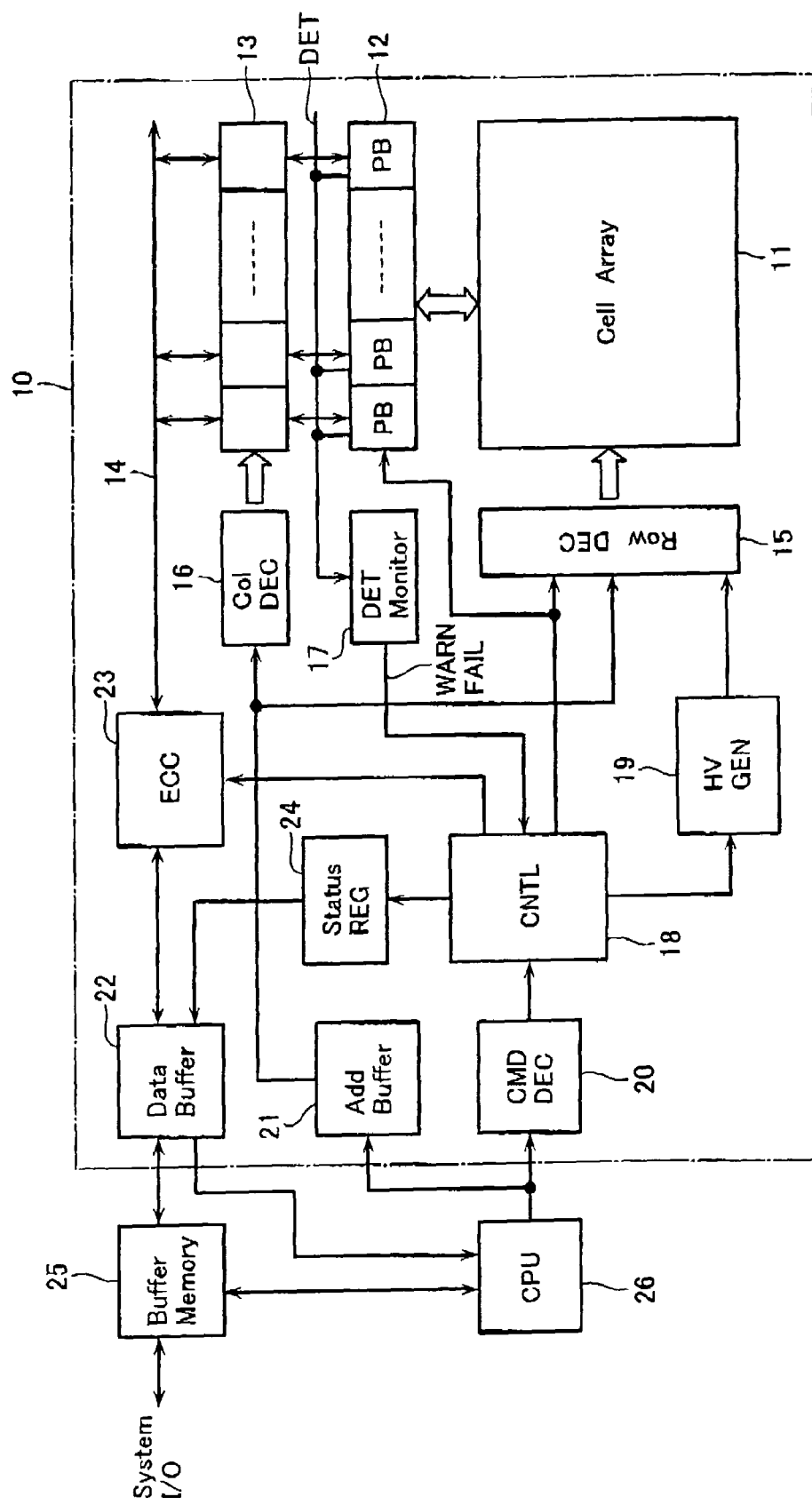
FIG. 1 shows a block configuration of a NAND-type flash memory in accordance with an embodiment of the present invention.

FIG. 1 shows a block configuration of a NAND-type flash memory chip 10 in accordance with an embodiment. A cell array 11 is, as described later, formed of NAND cell units arranged. A row decoder 15, which includes a word line driver, is disposed for selectively driving a word line in the cell array 11. A sense amplifier circuit 12 connected to bit lines of the cell array 11 serves as a page buffer for sensing read data of one page and storing write data of one page.

Disposed between the page buffer 12 and a data bus 14 is a column gate circuit 13 which Is controlled by a column decoder 16. Thus, one page data read in the page buffer 12 are serially output, for example, by a byte to the external I/O terminals via the data bus 14. Similarly, write data are serially transferred on the data bus 14 to be loaded into the page buffer 12.

Command data supplied from an external CPU 26 is decoded by a command decoder 20. Based on instructions of the command, an internal controller 18 executes sequential controls of write and erase, and controls of a read operation. Row and column addresses supplied from the external terminals via an address buffer 21 are transferred to the row and column decoders 15 and 16, respectively. Buffer memory 25 is disposed between I/O lines of the external system and the memory chip 10.

In this embodiment, an ECC circuit 23 Is disposed between a data buffer 22, which serves for data outputting and inputting, and the data bus 14 for error checking and correcting read data.

Further, in this embodiment, threshold margin judging circuits are disposed as described later in the respective sense units in the page buffer 12 for judging a threshold margin state of the read data. A common signal line DET is disposed to commonly connect the output nodes of the above-described threshold margin judging circuits. A monitor circuit 17 is prepared to monitor the signal line DET so as to output a warning signal "WARN" when the threshold margin of the read data is judged as being less than a certain level. In response to the warning signal "WARN", the controller 18 sets a warning flag in a status register 24 so as to being possible to output it to an external terminal.

Figure 2:
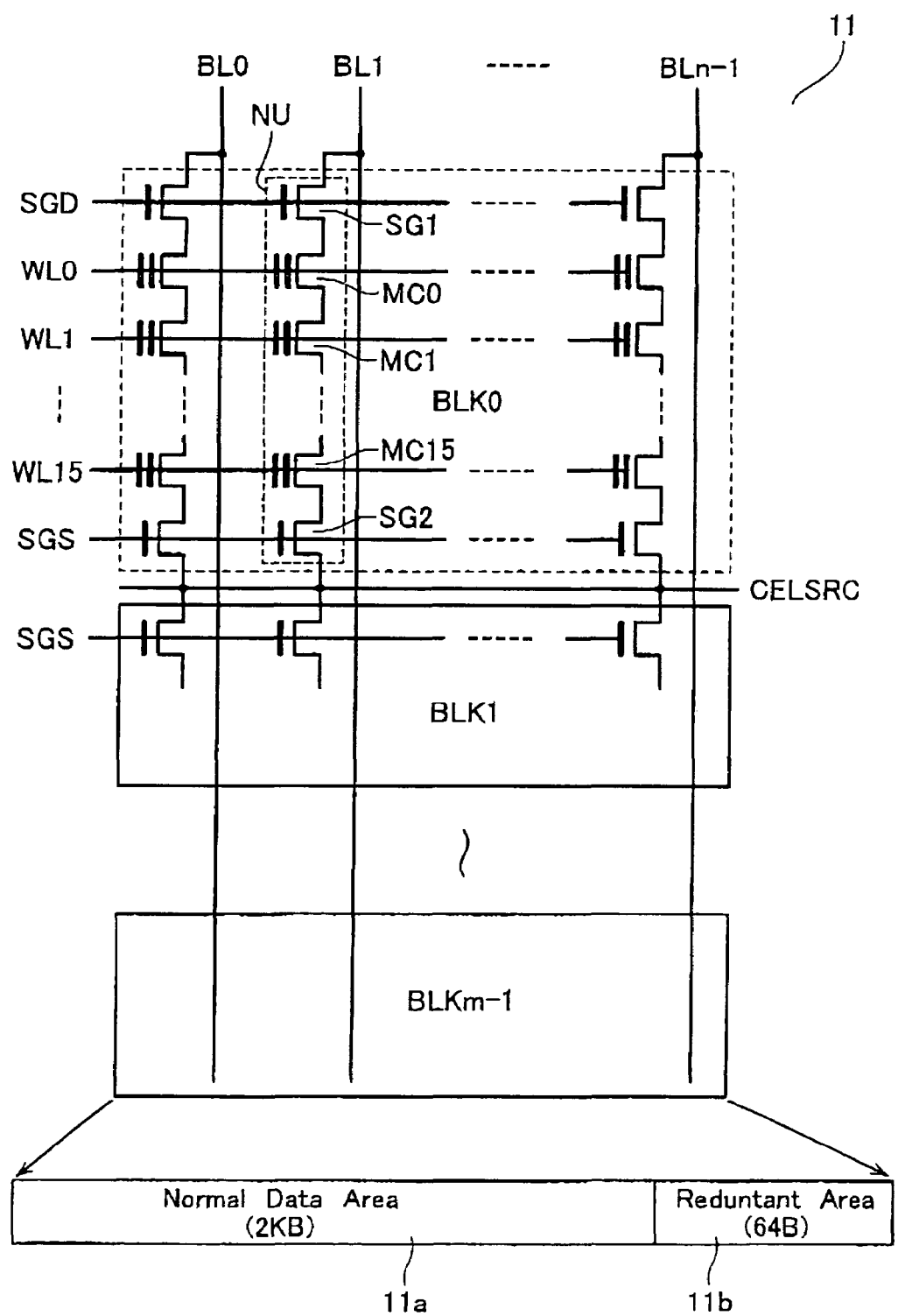
FIG. 2 shows a cell array configuration of the flash memory.

FIG. 2 shows a detailed arrangement of the cell array 11. A plurality of memory cells (i.e., sixteen memory cells In this case) MC0–MC15 16 are connected in series so as to constitute a NAND cell unit NU. The cell array 11 is formed of plural NAND cell units NU arranged in a matrix manner. Each memory cell MCi is a stacked gate MOS transistor with a floating gate serving as a charge storage layer, and stores a bit data in a non-volatile manner that is defined by a threshold voltage determined by a charge storage state of the floating gate as data. The cell data is electrically rewritable by electron injection operation into the floating gate and electron releasing operation therefrom.

One node of the NAND cell unit NU is coupled to a bit line BL via a select gate transistor SC1, and the other node to a source line CELSRC via another select gate transistor SG2. Control gates of the memory cells MCi in the NAND cell unit NU are connected to different word lines WLi. Gates of the select gate transistors SG1 and SG2 are connected to select gate lines SGD and SGS, respectively, which are disposed in parallel with the word lines WL.

One page defined as a group of memory cells arranged along a word line serves as a unit of data read and write. One block, which is defined as a group of NAND cell units with a shared word line, serves as a unit of data erasure. Usually, as shown in FIG. 2, a plurality of blocks BLKj (j=0, 1, ...) are arranged in the direction of the bit line BL. For example, as shown in FIG. 2, a normal data area 11a of 2 KByte and a redundant area 11b of 64 Byte constitute a page. The redundant area 11b includes ECC data storage area and data control information (for example, logical address) data storage area.

Figure 3:
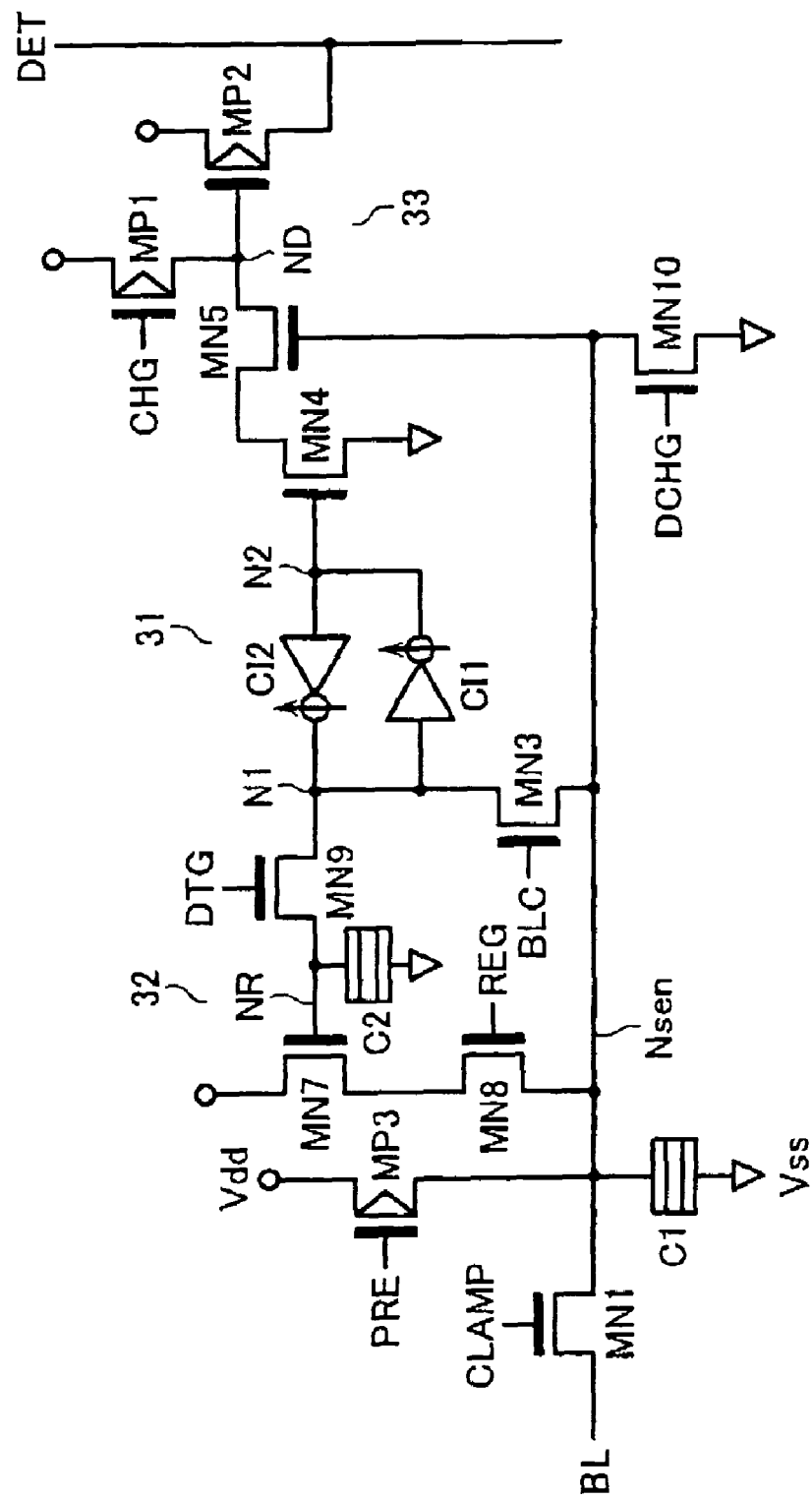
FIG. 3 shows a sense unit configuration of the flash memory.

FIG. 3 shows a configuration of a sense unit adapted to the page buffer 12. This sense unit is configured to detect voltage change of a bit line (in detail in this embodiment, detect whether the precharged bit line is discharged or not) in correspondence with a selected memory cell, thereby reading cell data.

An NMOS transistor MN1 disposed between sense node Nsen and bit line BL serves for clamping precharge voltage of the bit line BL and as a pre-sense amplifier for amplifying and transferring a to-be-detected bit line voltage to the sense node Nsen. A precharging PMOS transistor MP3 is connected to the sense node Nsen. If necessary, a charge holding capacitor C1 is also connected to the sense node Nsen. The sense node Nsen is coupled to a data node N1 of a data latch 31 via transferring NMOS transistor MN3. The data latch 31 has clocked inverters CI1 and CI2 disposed in parallel and with reverse polarities each other between data nodes N1 and N2.

In addition, a data storage circuit 32 is disposed between the sense node Nsen and dada node N1, which serves for temporarily holding read data. The gate of NMOS transistor MN7, drain of which is connected to a power supply node Vdd, serves as a data storage node NR. Preferably, a charge holding capacitor C2 is connected to the data storage node NR. A data transferring NMOS transistor MN9 is disposed between the data storage node NR and data node N1 of the data latch 31. In order to apply the power supply voltage Vdd to the sense node Nsen in response to data at the node NR, an NMOS transistor MN8 is disposed between the NMOS transistor MN7 and sense node Nsen.

In this embodiment, as described in detail later, a read operation is performed with a judging operation as to judge whether the respective cells corresponding to read out data bits have a sufficient threshold margin or not, and give a warning when the threshold margin is insufficient. To do the above-described threshold margin judgment, in a read mode in this embodiment, data sense operations are performed at a few timings after having started bit line discharge by selected cells, and then successive two resultants In the data sense operations are compared with each other.

The data storage circuit 32 is used for comparing plural bit line data sense results as described above. The data storage circuit 32 also serves as a data write back circuit. In detail, this data write back circuit functions to write back a write data, which is able to apply again a write bias only to an insufficiently written cell, to the data latch 31.

Connected to the data node N2 is a threshold margin judgment or decision circuit 33 which is used to judge or decide the threshold margin based on multiple bit line data sense results as described above. NMOS transistor MN4, gate of which is coupled to the data node N2, and NMOS transistor MN5, gate of which is coupled to the sense node Nsen, are connected in series between node ND and ground potential node Vss. A precharging PMOS transistor MP1 is coupled to the node ND. This transistor MP1 functions to turn on in response to "L" level (=Vss) application to gate CHG thereof at each threshold margin judgment time, thereby precharging the node ND at Vdd. Drain of a PMOS transistor MP2, gate and source of which are connected to node ND and power supply voltage node Vdd, respectively, is connected to the signal line DET. The signal line DET is commonly disposed for the entire sense units in the page buffer. Further connected to the sense node Nsen is a reset-use NMOS transistor MN10.

In the threshold margin judgment circuit 33, NMOS transistors MN4 and MN5 constitute a logic gate together with PMOS transistor MP1 for detecting that to-be-compared data stored at nodes NR and N1 are inverted in logic. PMOS transistor MP2 is an output transistor of the logic gate for outputting a warning signal to the signal line DET.

Detect whether MNOS transistors MN4 and MN5 become on simultaneously or not in response to the successive two bit line data sense results, and the threshold margin of read out data may be judged. In case at least one data bit in a read out page data has an insufficient data margin, a warning signal will be output to the signal line DET. Details thereof will be explained later.

The threshold margin judging circuit 33 also serves as a verify judgment circuit used in write and erase modes. That is, this circuit is used for checking whether data write or erasure is completed or not in response to a check signal CHG after verify-read.

Figure 4:
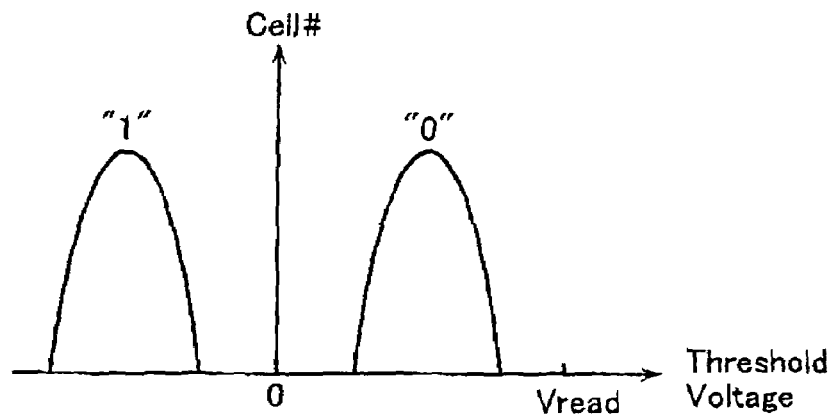
FIG. 4 shows data threshold distributions of the flash memory.

FIG. 4 shows data threshold distributions in case this NAND flash memory is designed to store binary data. The negative threshold state is a logic "1" data (i.e., erase state), and the positive threshold state is a logic "0" data (i.e., write state in the narrow sense). Data "0" write is done by electron injection with FN tunneling current carried from channel to floating gate in a selected cell.

In detail, one page data write is performed as follows: supply Vss and Vdd–Vth (Vth: threshold voltage of the select gate transistor SG1) to channels of selected cells in the NAND cell units from the respective bit lines in correspondence with write data "0" and "1", respectively, and then apply a write voltage Vpgm (e.g., 20V) to a selected word line. Under this condition, a large electric field is applied between the channel and the floating gate in a selected memory cell to which "0" data is supplied, thereby causing electron injection into the floating gate ("0" write); while the channel is boosted in potential by capacitive coupling in a selected cell to which "1" data is supplied, whereby electron injection does not occur in the cell (write inhibit).

In practice, data write is performed by repeating write pulse voltage application and verify-read for verifying the written state (i.e., write-verify) until the entire write data of one page have been completely written.

Data erasure is done as follows: apply 0V to the entire word lines in a selected block, let the select gate lines SGD, SGS, all bit lines and the common source line CELSRC be floating, and apply an erase voltage Vera (e.g., 20V) to a p-well on which the cell array is formed. As a result, all memory cells in the selected block are forced to release electrons of the floating gates to the channels, thereby being in a negative threshold state (i.e., data "1").

Figure 5:
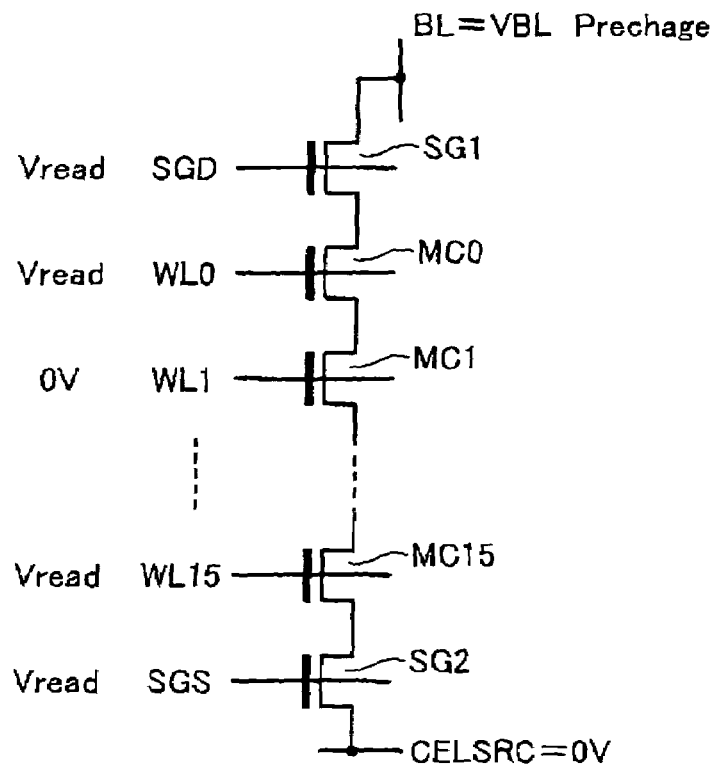
FIG. 5 shows a bias condition at a data read time of the flash memory.

A data read operation of the flash memory in accordance with this embodiment will be explained bellow. FIG. 5 shows a bias condition in a read mode with giving attention to a NAND cell unit. In the read mode, bit line BL is precharged at VBL lower than the power supply voltage Vdd. Thereafter, apply 0V to a selected word line (WL1 in case of FIG. 5), and apply a pass voltage Vread to the remaining word lines, select gate lines SGD, SGS. The pass voltage Vread is set as to turn on cells without regard to cell data as shown in FIG. 4. Under this bias condition, a "1" data cell within the memory cells arranged along the selected word line WL1 becomes on, whereby the bit line connected to the "1" data cell will be discharged; while a "0" data cell is held at an off-state, whereby the corresponding bit line will not be discharged. Detect the bit line discharge states, which are different from each other corresponding to cell data, and it is possible to determine cell data.

Figure 6:
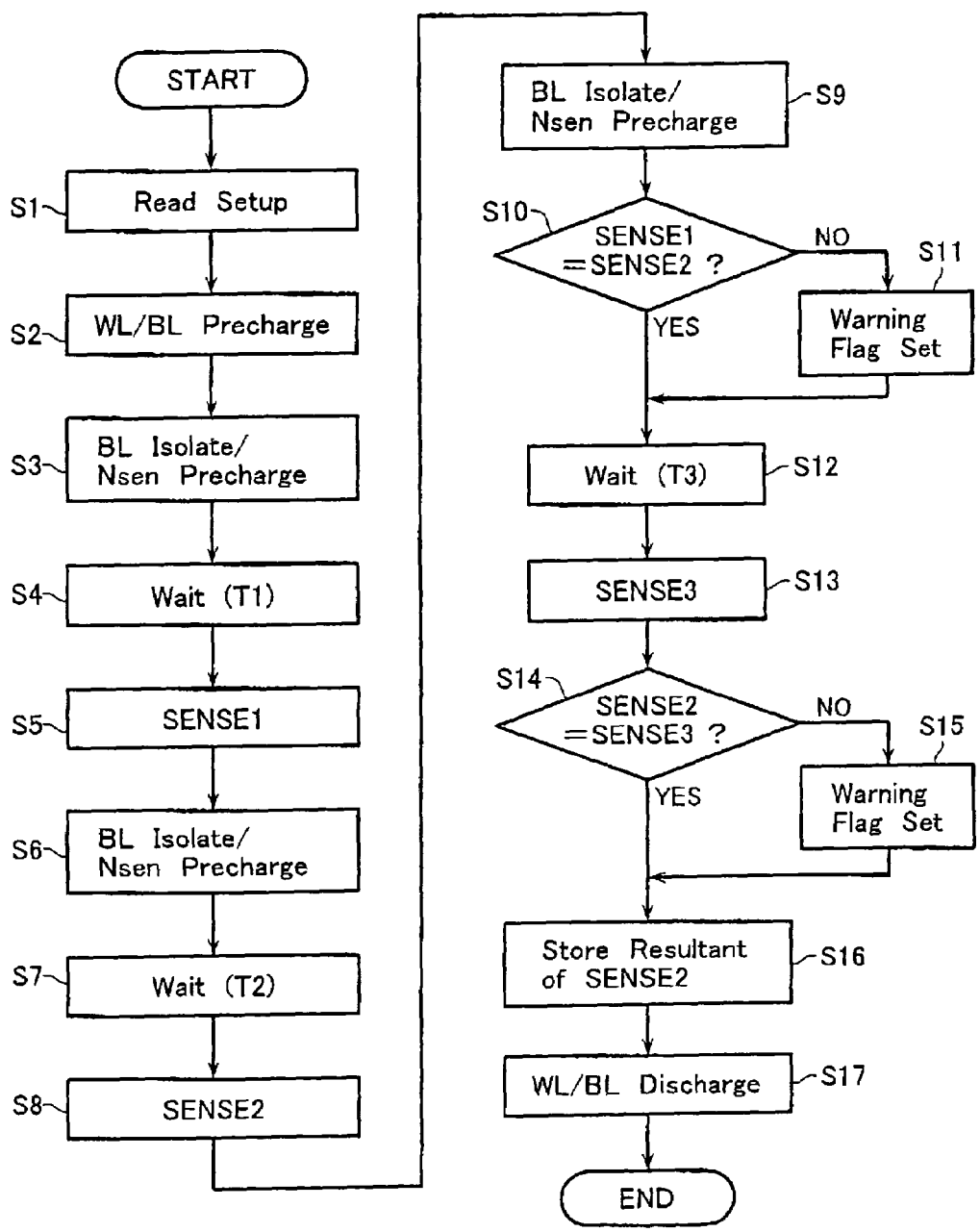
FIG. 6 shows a data read operation flow of the flash memory.
Figure 7:
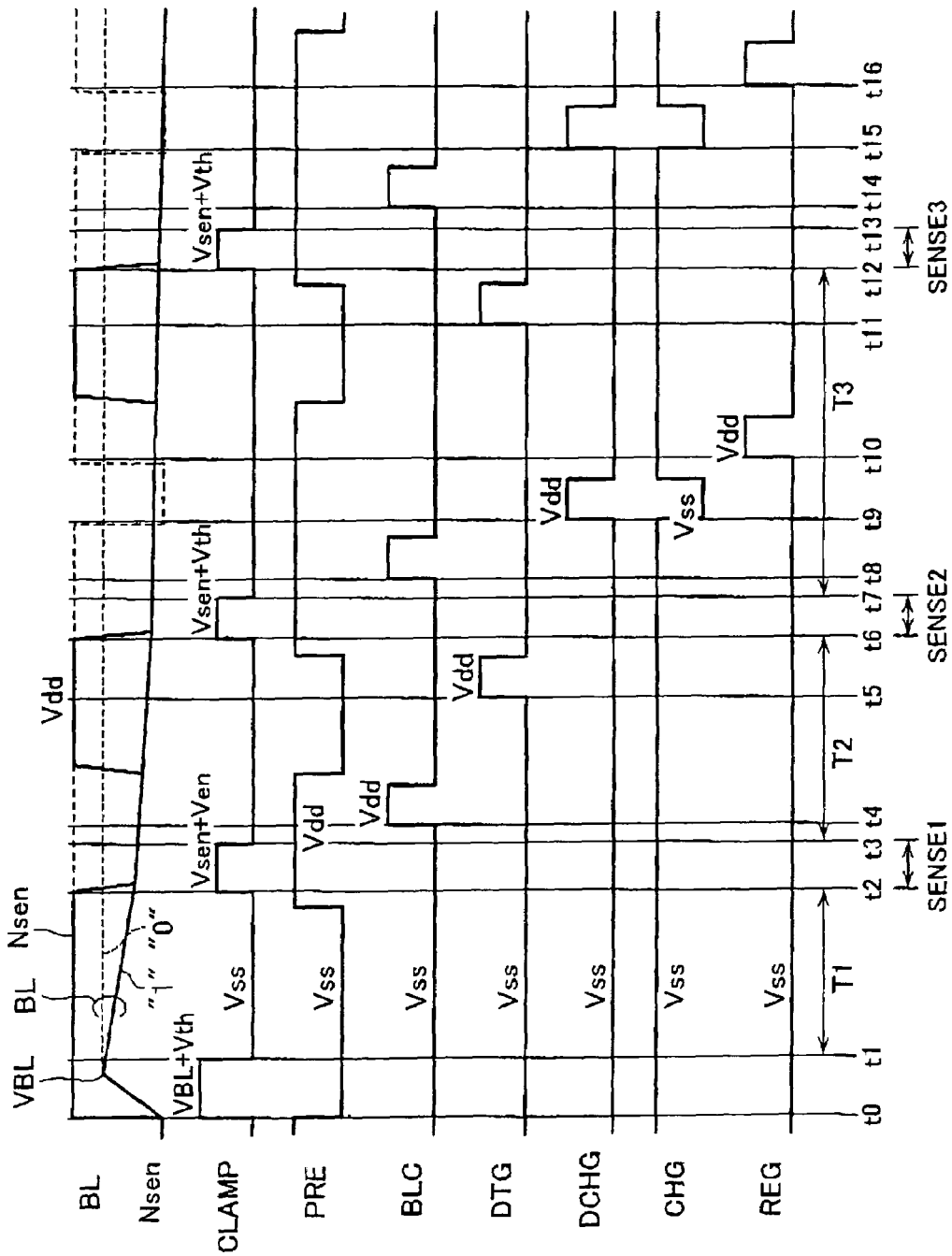
FIG. 7 shows a data read operation timing chart of the flash memory.

FIG. 6 shows a sequence control flow of a read operation, and FIG. 7 shows a timing chart of the read operation by giving attention to the sense unit shown In FIG. 3. As shown in these drawings, in this embodiment, three data sense steps of SENSE1 (step S5), SENSE2 (step S8) and SENSE3 (step S13) are executed during the bit line discharge continues after the beginning thereof (timing t1). Based on these sense results, it is judged whether the data state of selected cells is stabilized or not, i.e., whether data margin (threshold margin) is sufficiently large or not. Details thereof will be described bellow.

Receiving read address and command, the controller 18 executes an initial read setup (step S1). At this read setup, the high voltage generation circuit 19 Is driven to generate internal high voltages necessary for the read operation. Next, start precharge operations for word lines WL and bit lines BL (step S2). As shown in FIG. 5, 0V and Vread are applied to a selected word line and the remaining word lines, respectively; and Vread is applied to select gate lines SGD and SGS. Note here that the select gate line SGD disposed at bit line side is held at 0V until the bit line discharge starts.

The bit line discharge operation Is, as shown in FIG. 7, preformed by applying VBL+Vth (Vth; threshold voltage of an NMOS transistor) to the gate CLAMP of transistor MN1, and applying a "L"(=Vss) level signal to the gate PRE of transistor MP3 at timing t0. The sense node Nsen is prechaged at Vdd via the precharging transistor MP3, and the bit line BL at VBL(<Vdd) via the precharging transistor MP3 and clamping transistor MN1.

While the sense node precharge operation continues, stop the bit line precharge operation at timing t1, thereby letting the bit line BL be in a floating state with a precharged voltage of VBL (step S3). Simultaneously, apply Vread to the select gate line SGD, and the bit line BL is discharged in correspondence with the selected cell's data. That is, the bit line BL is discharged with cell current to be gradually reduced in potential in case the selected cell's data is "1" (as shown by a solid line), while the bit line BL is held at about precharged level of VBL In case the selected cell's data is "0" (as shown by a dotted line) on the assumption that potential reduction due to the cell's leakage is negligible small. Although FIG. 7 shows typical bit line discharge curves in case of data "0" and "1", various discharge curves are obtained in practical in correspondence with the respective data states (i.e., threshold states) of the selected cells.

Waiting a certain time T1 (step S4) after the beginning of the bit line discharge, first bit line data sense SENSE1 is performed (step S5). In detail, as shown in FIG. 7, turn off the precharging transistor MP3 by applying "H" level (=Vdd) to the gate PRE, and then apply a sense-use voltage Vsen+Vth (Vsen<VBL) to the gate CLAMP of the clamping transistor MN1 (during t2–t3). If cell data is "0", transistor MN1 is kept off, and the sense node Nsen is held at the "H" level. If the bit line BL has been discharged to be at a sufficient low level due to cell data "1", transistor MN1 turns on, thereby causing the sense node Nsen to be reduced in potential due to charge sharing between the sense node Nsen and bit line BL. In detail, supposing that the capacitance of the bit line BL is sufficiently larger than that of the sense node Nsen, the sense node Nsen will be reduced in potential to be approximately equal to that of the bit line BL due to the above-described charge sharing. As a result, the bit line voltage is amplified to be transferred to the sense node Nsen.

Applying a "H" level signal (=Vdd) to the gate BLC to turn on the transferring transistor MN3, the result of the bit line data sense is transferred to and stored in the data latch 31. Although the clocked inverters CI1 and CI2 of the data latch 31 are, in practice, sequentially activated so as to hold the sensed data, details thereof are omitted in the timing chart shown in FIG. 7.

While the sensed data is transferred to the data latch 31, the bit line BL is isolated from the sense unit to be set at a floating state again, thereby being discharged continuously. Further, after having transferred the sensed data, turn on the transistor MP3 to precharge the sense node Nsen at Vdd again (step S6). While the sense node Nsen is precharged, apply a "H" level signal (=Vdd) to the gate DTG to turn on the transferring transistor MN9, and the stored data in the data latch 31 is transferred to the data storage node NR (at timing After waiting a certain time T2 (step S7), applying the sense use voltage Vsen+Vth to the gate CLAMP again (during t6–t7), the second bit line data sense SENSE2 is performed (step S8). Turning on the transferring transistor MN3, the result of this bit line data sense is transferred to the data latch 31 (at timing t8).

While the sensed data is transferred to the data latch 31, resume the bit line discharge operation, and precharge the sense node Nsen (step S9). Note here that prior to the sense node precharge, data comparing is performed between the results of the first and second data senses SENSE1 and SENSE2 (step S10). When data bits are inverted between two data senses SENSE1 and SENSE2 (i.e., the first sensed result is "0", while the second sensed result is "1"), the controller detects this situation to set a warning flag to the status register 24 (step S11).

In detail, the above-described data comparison between two sense results is performed as to judge threshold margin for the respective bit lines with the threshold margin judgment circuit 33 in the sense unit shown in FIG. 3. In this margin judgment step, initially and simultaneously turning on the reset-use transistor MN10 and check-use transistor MP1 with DCHG="H"(=Vdd) and CHG="L"(=Vss), respectively, thereby applying Vss and Vdd to the nodes Nsen and ND, respectively (timing t9). Next, turn on the transistor MN8 with REG="H"(=Vdd) so as to transfer the stored data at the data storage node NR to the sense node Nsen (timing t10).

ON/OFF of the transistors MN4 and MN5 in the threshold margin judgment circuit 33 will be determined by whether the data held at the storage node NR, which is obtained by the first data sense SENSE1, is identical with or not that held at the data node N2, which is obtained by the second data sense SENSE2. Based on the ON/OFF of transistors MN4 and MN5, it is determined whether the node ND is discharged of not. A signal will be generated on the detecting signal line DET in response to the level change of the node ND. Details of the threshold margin judgment will be described later.

While the sense node Nsen is precharged again during a waiting time period T3 (step S12), turn on the transferring transistor MN9 at timing t11, thereby transferring the sensed data stored in the data latch 31 to the data storage node NR. After having stopped the precharge operation of the sense node Nsen, applying the sense-use voltage Vsen+Vth to the gate CLAMP of the clamping transistor MN1 (during t12–t13), the third bit line data sense SENSE3 is performed (step S13). Turn on the transferring transistor MN3, and the result of this bit line data sense is transferred to and held in the data latch 31 (timing t14).

Compare the result of the third data sense SENSE3 with that of the second data sense SENSE2 (step S14), and the controller sets a warning flag to the status register 24 when these sensed results are detected to be different from each other (step S15).

In this embodiment, assuming that the timing of the second data sense SENSE2 within the three data senses SENSE1–3 is identical with that in the conventional read scheme, the result of the second data sense SENSE2 is stored in the page buffer 21 as a read out data (step S16). In detail, turning on the transistors MN8 and MN3, the stored data at the storage node NR is written back to the data latch 31. Then, discharge the bit lines BL and word lines WL to end the read operation (step S17). Thereafter, input the read enable signal from the external, and page data stored in the page buffer 12 are serially output by a byte.

Figure 8:
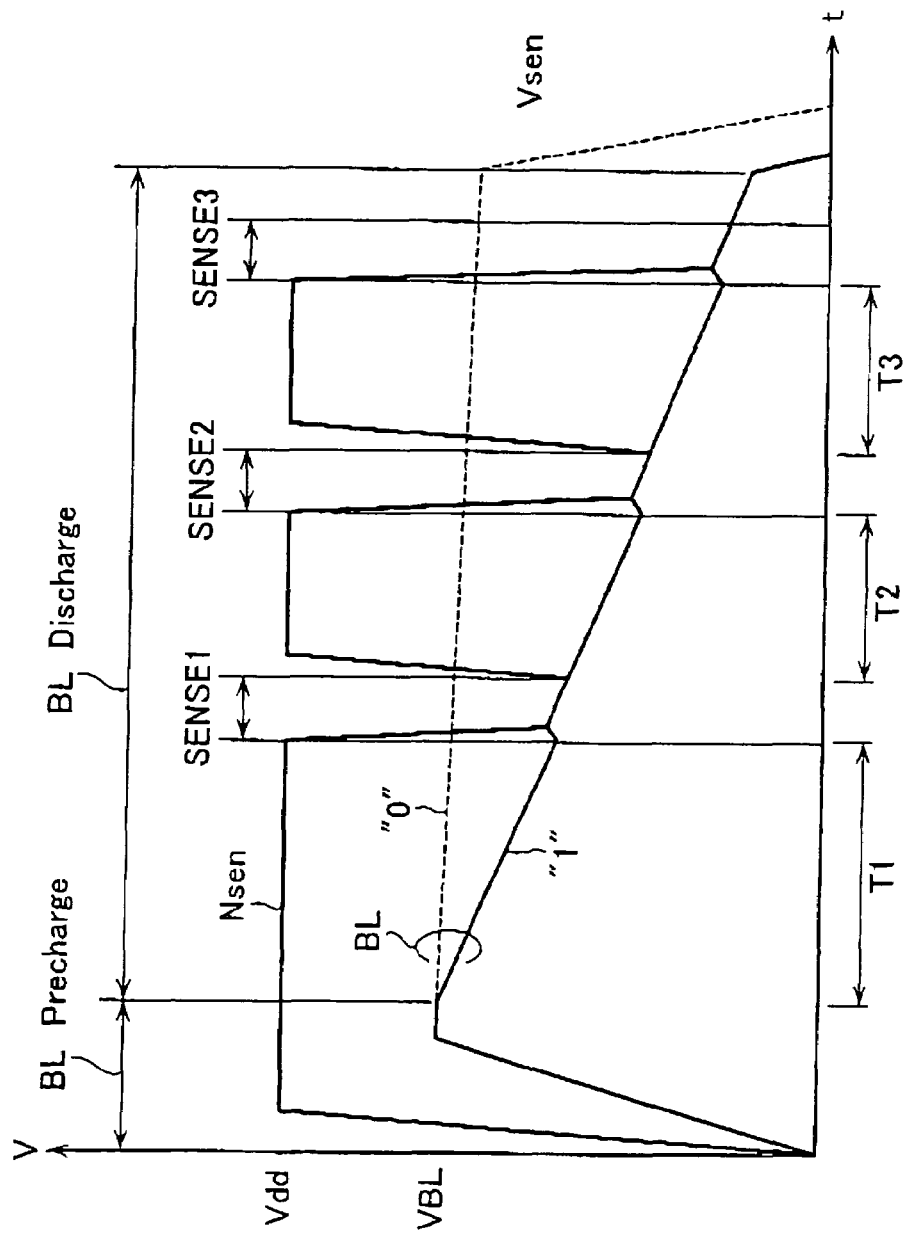
FIG. 8 shows voltage change waveforms of the bit line and sense node at the data read time of the flash memory.

FIG. 8 shows the above-described data sense operation with giving attention only to the bit line BL and sense node Nsen. The sense-use voltage Vsen applied to the clamping transistor MN1 is, as shown in FIG. 8, set at an intermediate level between "H" level (data "0") and "L" level (data "1") after bit line discharge with a certain time period. Referring to the first data sense SENSE1 and the second data sense SENSE2, It is evident that the former is a read operation with a "1" data margin less than the latter. In other words, in case the threshold of "1" data cell has been insufficiently lowered, it is possible that "1" data is sensed as "0" data at the first data sense SENSE1. By contrast with this, referring to the second data sense SENSE2 and the third data sense SENSE3, "0" data margin of the latter is less than that of the former. Therefore, in case the "0" data cell has not been written into a sufficiently high threshold state and is leaky, it is possible that "0" data is sensed as "1" data at the third data sense SENSE3.

The above-described situations will be explained in other words as follows: in case the threshold margins of the selected cells are sufficiently large (i.e., the leakage current of each "0" data cell is negligible small, and the discharge current carried by each "1" data cell is sufficiently large), three data sense results become identical with each other, while the sensed result may be changed from non to "1" somewhere during three data senses in case the margin of at least one of data "0" and "1" is little. Explaining in detail, in case the bit line discharge curve determined by "1" data cell is gently sloping, it is possible that the "1" data is detected as "0" data (error data) at the first sense SENSE1 and as "1" data at the second sense SENSE2. By contrast, in case the leakage current of "0" data cell is large, it Is possible that the "0" data is detected as "0" data at the second sense SENSE2, and as "1" data (error data) at the third sense SENSE3.

To judge the above-described data Inversion (logic inversion) between the successive two data senses, the steps S10 and S14 are prepared. Referring to FIGS. 9–11, the threshold margin judgment operation performed by detecting the above-described data inversion will be described in detail. FIGS. 9 to 11 show three situations of the sense unit at the threshold margin judging times.

FIG. 9 shows a case where "0" data is sensed at the preceding dada sense time (I.e., storage node NR="H"), and "0" data is sensed at the following data sense time (i.e., data node N1="H"). The sense node Nsen has been reset at Vss in advance by turning on the transistor MN10. In this state, applying a "H" level signal to the gate REG of transistor MN8, both of transistors MN7 and MN8 become on due to the storage node NR="H", whereby Vdd is applied to the gate of transistor MN5 via the sense node Nsen as shown by a dotted line. As a result, transistor MN5 is turned on. However, transistor MN4 driven by the data node (="L") is kept in an off-state. Therefore, the precharged node ND is not discharged and held at the precharged "H" level.

FIG. 10 shows a case where "0" data is sensed at the preceding dada sense time (i.e., storage node NR="H"), and "1" data is sensed at the following data sense time (i.e., data node N1="L"). In this state, applying an "H" level signal to the gate REG of transistor MN8, both of transistors MN7 and MN8 become on, whereby Vdd is applied to the gate of transistor MN5 via the sense node Nsen as shown by a dotted line. Therefore, transistor MN5 is turned on. Transistor MN4 also is driven by the data node N2="H" to be turned on. As a result, the node ND is discharged to be in an "L" level state.

FIG. 11 shows a case where "1" data is sensed at the preceding dada sense time (i.e., storage node NR="L"), and "1" data is sensed at the following data sense time (i.e., data node N1="L"). In this state, since transistor MN7 is kept off, even if the transistor MN8 is turned on, Vdd is not applied to the gate of transistor MN5. Therefore, although transistor MN4 is turned on, the precharged node ND is not discharged and held at the precharged "H" level.

As described above, in case the sense data changes from "0" to "1" during three bit line data senses, the node ND of the threshold margin judgment circuit 33 in the sense unit is reduced in level. In response to this, the transistor MP2 turns on, thereby generating an "H" level signal on the common signal line DET. In other words, in case the threshold margin of at least one in one page read data is small, a warning signal is generated on the common signal line DET. The monitor circuit 17 shown in FIG. 1 monitors this signal line DET to output a warning signal "WARN" when data margin is small, and transfer it to the controller 18. The controller 18 receives this signal to set a warning flag at the status register 24.

Note here that the threshold margin judgment circuit 33 also is used as a verify judgment circuit in data write and erase modes as above-described. For example, in the write mode, command and address are input from CPU 26. In response to these, the internal controller 18 executes to repeat a write cycle with write voltage application and verify-read until the entire "0" write bits in one page data are completely written. Having completed data write, the verify judgment circuit 33 outputs a "Pass" flag. Receiving this flag, the controller 18 ends the write sequence.

If the data write is not passed in spite of that the write cycle has been repeated with a predetermined number of times, the controller 18 sets a "Fail" flag at the status register 24 and then ends the write sequence. CPU 26 may confirm whether the data write is passed or failed based on the information of the status register 24.

By use of the read scheme In accordance with the above-described embodiment, it becomes possible to judge the margin of the read out data. Further, by use of the read scheme, it is possible to judge the possibility of bit error appearance in the read out data. In detail, it becomes possible to control the read operation as follows: execute error checking and correcting in case the warning flag is set in the status register 24, i.e., the possibility of bit error appearance is high; and do not execute error checking and correcting in case the warning flag is not set.

Figure 12:
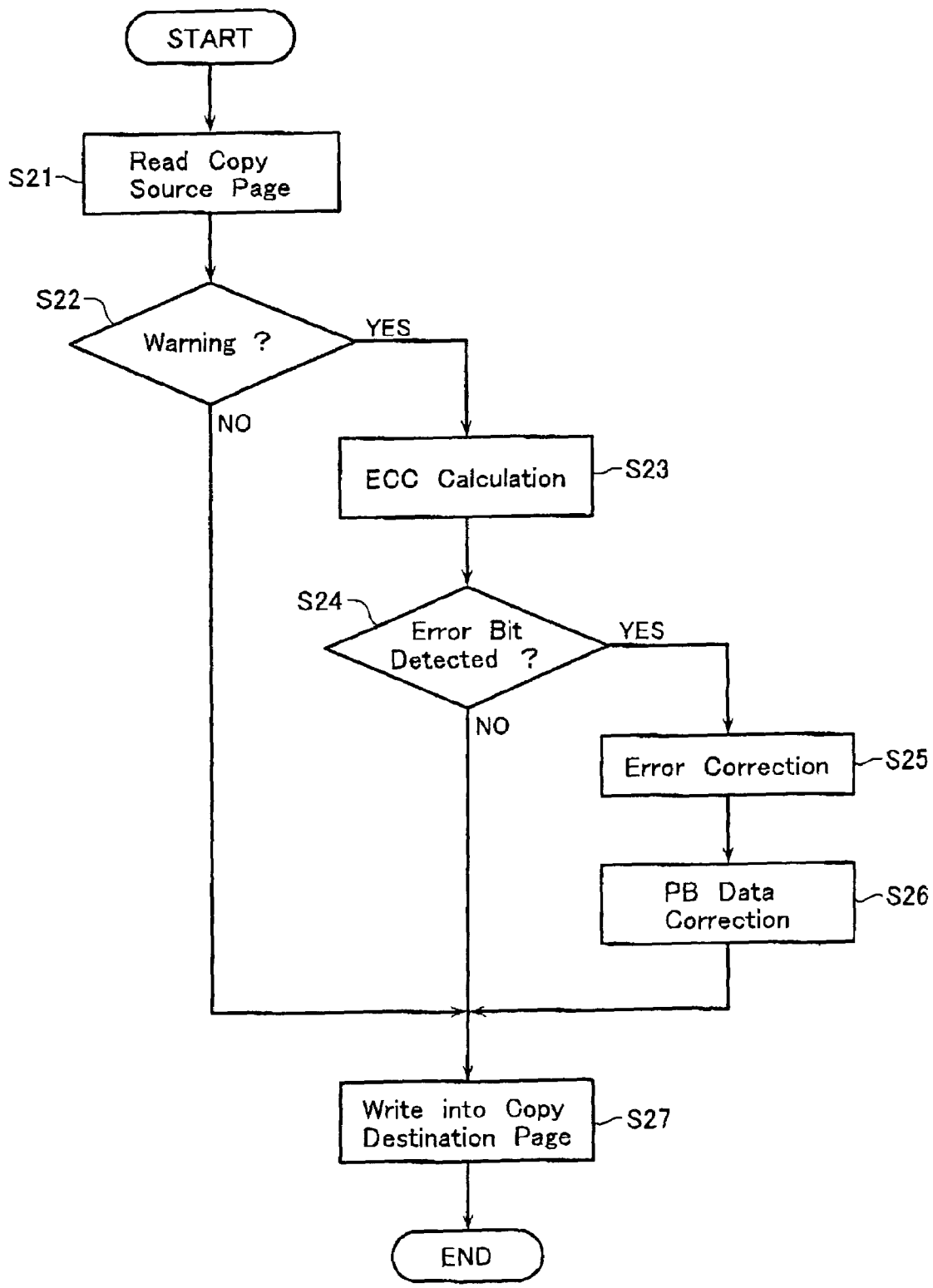
FIG. 12 shows a page copy operation flow of the flash memory.

An example of page copy operation, to which the above-described read scheme is adapted, will be explained in detail bellow. FIG. 12 shows a page copy operation flow controlled by the controller 18. Inputting copy source page address and command from the external, the controller 18 executes data read operation as to read out data of the copy source page to the page buffer 12 (step S21). Having finished this data read operation, the internal controller 18 checks whether the warning flag is set or not in the status register 24 (step S22). If the warning flag has not be set, input copy destination page address from the external, and the controller 18 executes a write operation in such a way as to write the read out data of the page buffer 24 into the copy destination page as it is (step S27).

In case the warning flag has been set, go to an ECC calculation phase (step S23). At this phase, the controller 18 executes to serially transfer the read out data stored in the page buffer 24 by a byte to input them into the ECC circuit 23 for checking whether there is an error bit or not. As described above, since the warning flag merely designates that the threshold margin is not sufficient as a result of the threshold margin judgment, it may not necessarily designate that there is an error bit in the read out data. If no error bits are detected (step S24), write the read out data of the page buffer 24 into the copy destination page as it is (step S27).

If an error bit is detected (step S24), error correction is done in the ECC circuit 23 (step S25), and corrected data is written back into the page buffer 12 (step S26). Although this data write back may be done for the entire bits of one page, it may preferably be done by over-writing only a byte data including the corrected bit. The corrected page data stored in the page buffer 12 will be written into the copy destination page (step S27).

As described above, in the page copy operation in accordance with this embodiment, error checking and correcting is performed only In case the possibility of error appearance is high. To do error checking and correcting for one page data, it is required as previously explained to input read out data into the ECC circuit by a byte, thereby resulting in that it takes a long time. According to this embodiment, it may be omitted the above-described error checking and correcting operation in case the possibility of error appearance is little. Therefore, it becomes possible to do a high-speed page copy operation.

[Embodiment 2]

In the embodiment shown in FIG. 1, the ECC circuit 23 is installed in the memory chip 10. In this case, to do or not to do the ECC calculation and error correction for the read out page data, the internal controller 18 decide itself based on the information of the status register 21.

Figure 13:
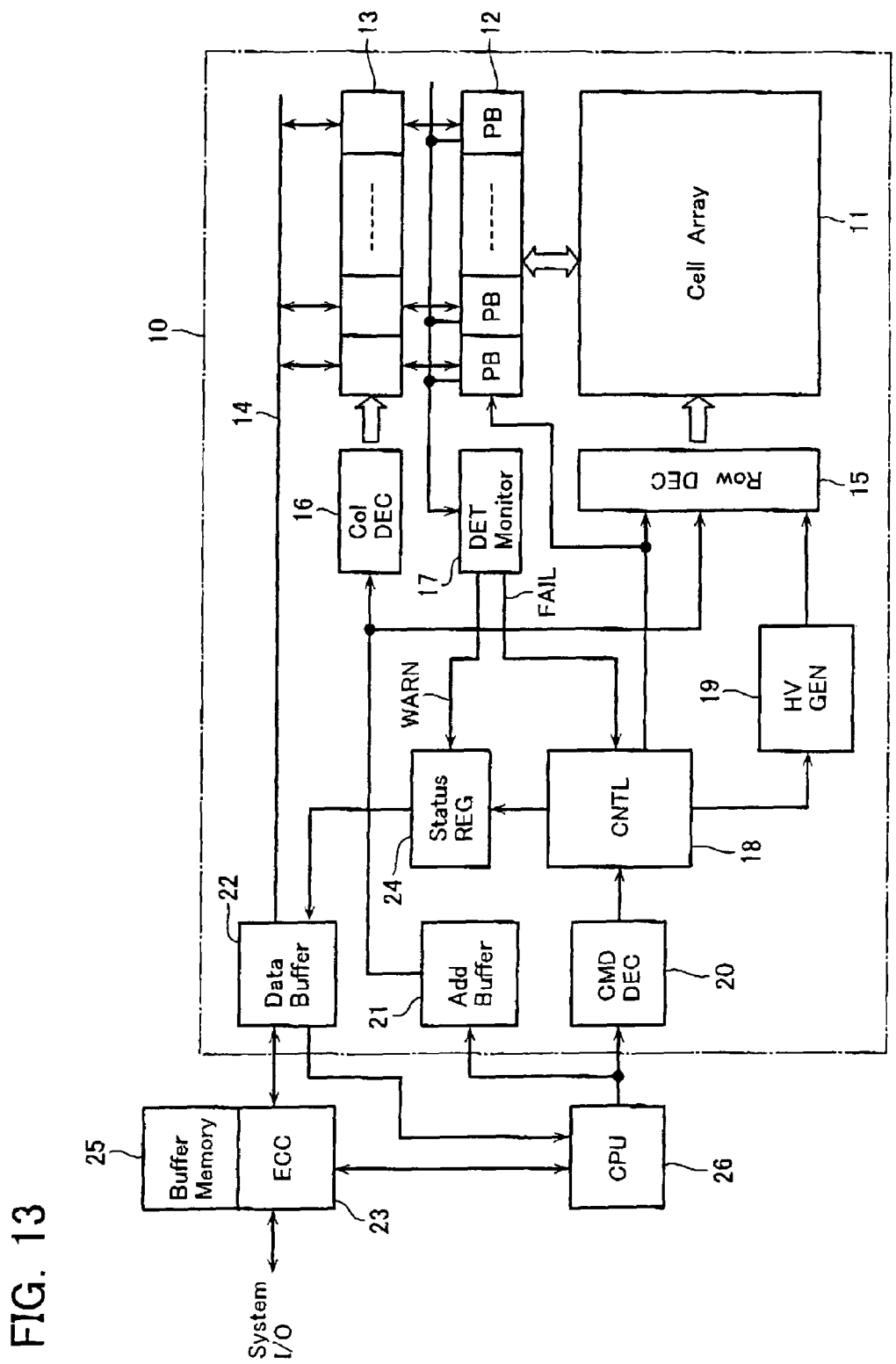
FIG. 13 shows a block configuration of a NAND-type flash memory in accordance with another embodiment of the present invention.

By contrast to this, FIG. 13 shows another case where the ECC circuit 23 is disposed outside the memory chip 10. In this case, a page copy operation may be done as follows.

The read operation for reading copy source page data into the page buffer 12 Is the same as that in the above-described embodiment. In the page buffer 12, It is judged in the read mode whether the threshold margin of the read out data is sufficiently large or not. In case the threshold margin is small, the warning flag "WARN" generated from the monitor circuit 17 is not input to the controller 18, but directly set in the status register 24.

The external CPU 26 judges prior to activating the ECC circuit 23 whether there is necessity for ECC calculation or not based on the information stored in the status register 24. If there is no necessity, the CPU 26 inputs copy destination page address, whereby the read out data stored on the page buffer 12 is written into the copy destination page at it is. The write sequence control is done by the controller 18 as similar to the above-described embodiment.

In case the ECC calculation is required, CPU 26 supplies read enable signals to the memory chip 10. In response to the read enable signals, the read data stored in the page buffer 12 are serially output to be input into the ECC circuit 23, thereby being subjected to ECC calculation and error correction. Corrected data is loaded in the page buffer 12, and then written into the copy destination page. As similar to the above-described embodiment, only a byte data including a corrected bit may be over-written into the page buffer 12.

According to this embodiment, the same effect may be obtained as above-described embodiment.

[Embodiment 3]

As an embodiment, an electric card using the non-volatile semiconductor memory devices according to the above-described embodiments of the present invention and an electric device using the card will be described bellow.

Figure 14:
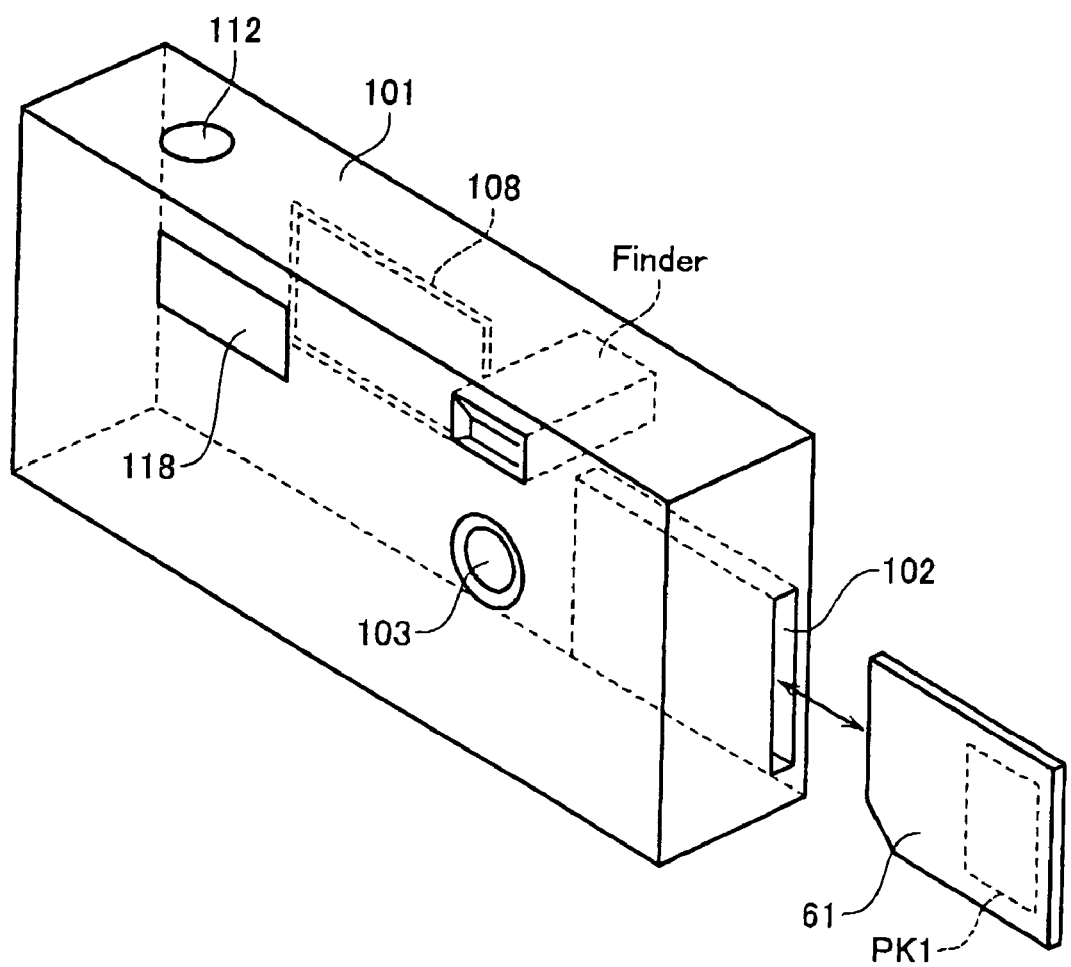
FIG. 14 shows an embodiment applied to a digital still camera.

FIG. 14 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 15:
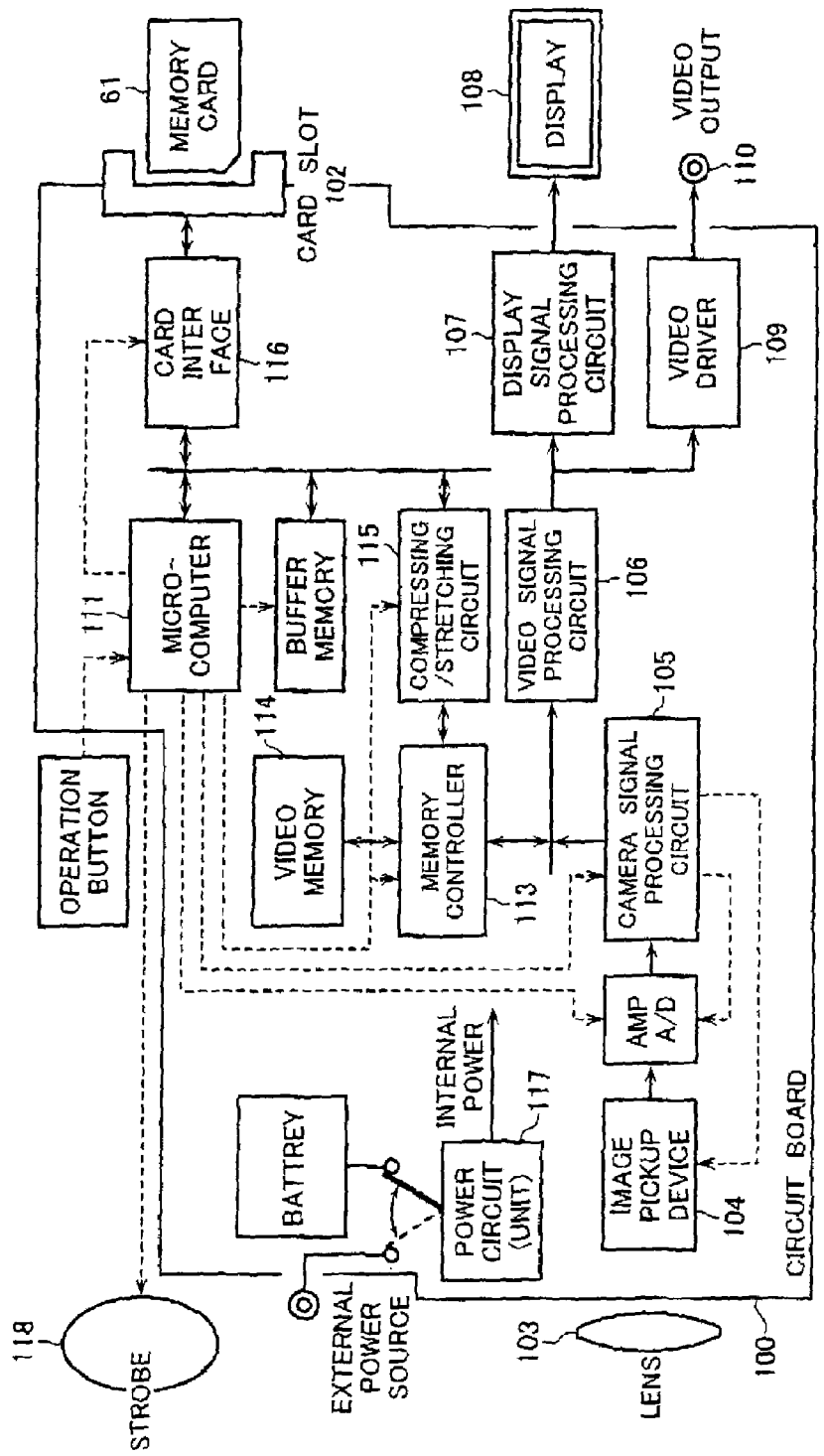
FIG. 15 shows an internal configuration of the digital still camera.
Figure 16A:
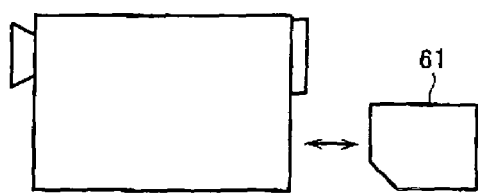
FIGS. 16A to 16J show other embodiments applied to various devices.
Figure 16F:
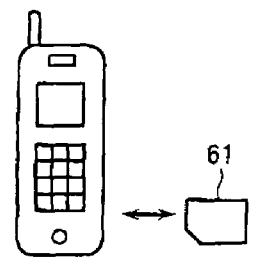
Figure 16B:
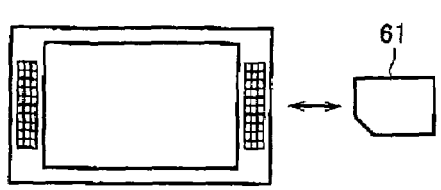
Figure 16G:
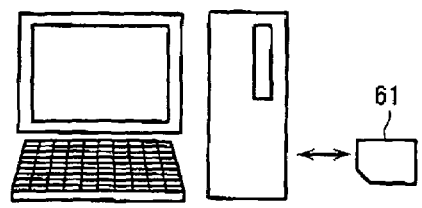
Figure 16C:
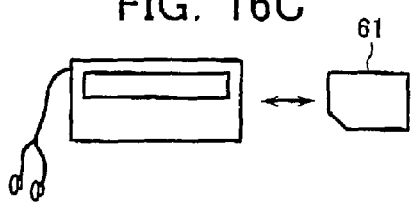
Figure 16H:
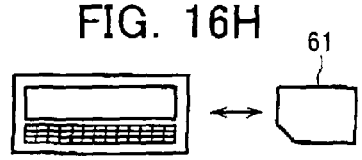
Figure 16D:
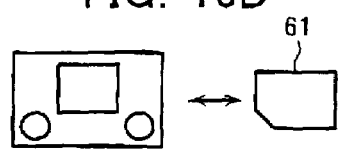
Figure 16I:
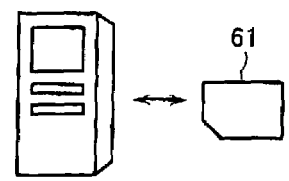
Figure 16E:
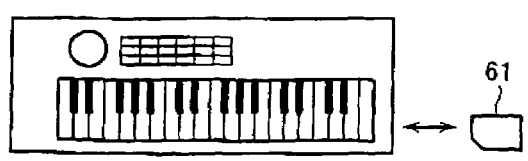
Figure 16J:
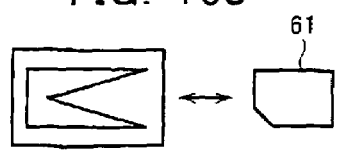

FIG. 15 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 Is also mounted on the circuit board 100. The power circuit 117 receives power from an external power source or battery and generates an internal power source voltage used inside the digital still camera 101. For example, a DC—DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 16A to 16J, as well as in portable electric devices. That is, the electric card can also be used in a video camera shown in FIG. 16A, a television set shown in FIG. 16B, an audio apparatus shown in FIG. 16C, a game apparatus shown in FIG. 16D, an electric musical Instrument shown in FIG. 16E, a cell phone shown in FIG. 16F, a personal computer shown in FIG. 16G, a personal digital assistant (PDA) shown in FIG. 16H, a voice recorder shown in FIG. 16I, and a PC card shown in FIG. 16J.

This invention is not limited to the above-described embodiment. For example, while it has been explained that the memory cell array is formed of NAND cell units, it should be appreciated that this invention may be applied to, for example, a NOR-type flash memory. Further, it will be understood by those skilled in the art that various changes in form and detail may be made without departing from the spirit, scope, and teaching of the invention.

What is claimed is:

1. A non-volatile semiconductor memory device comprising:
   a cell array having electrically rewritable and non-volatile memory cells arranged therein; and
   a sense amplifier circuit configured to detect voltage change of a bit line in said cell array, thereby reading data of a selected memory cell coupled to the bit line, wherein
   said sense amplifier circuit is controlled to read data at plural timings within a period in which the bit line voltage is changing in correspondence with said selected memory cell, and compare data read out by successive two data read operations with each other so as to judge a threshold margin of said selected memory cell.

2. The non-volatile semiconductor memory device according to claim 1, wherein
   said sense amplifier circuit comprises:
   a first transistor disposed to selectively connect a sense node to a bit line of said cell array for clamping bit line voltage and transferring bit line voltage to the sense node;
   a second transistor coupled to the sense node to serve for precharging the sense node and bit line;
   a data latch configured to detect the bit line voltage to latch a read data;
   a data storage circuit configured to temporarily store the read data transferred from said data latch; and
   a threshold margin judgment circuit configured to compare a first read data stored in said data storage circuit with a second read data read out later than the first read data to be latched in said data latch so as to output a warning signal in case data inversion is detected between the first and second read data.

3. The non-volatile semiconductor memory device according to claim 2, further comprising an ECC circuit controlled to do error-checking and correcting for read data only when the warning signal is output.

4. The non-volatile semiconductor memory device according to claim 2, further comprising:
a controller having a page copy function that reads a page data of said cell array and write it into another page; and
an ECC circuit controlled to do error-checking and correcting for read data of a copy source page only when the warning signal is output.

5. The non-volatile semiconductor memory device according to claim 1, wherein
said cell array comprises a plurality of NAND cell units arranged therein, each NAND cell unit having memory cells connected in series with control gates coupled to different word lines, respectively, a first select gate transistor disposed to couple one end of said memory cells connected in series to a bit line, and a second select gate transistor disposed to couple the other end to a common source line, and wherein
said cell array has a plurality of blocks arranged in the direction of a bit line, each block being defined as a group of NAND cell units with a shared word line.

6. An electric card equipped with a non-volatile semiconductor memory device defined in claim 1.

7. An electric device comprising:
a card interface;
a card slot connected to said card interface; and
an electric card defined in claim 6 and electrically connectable to said card slot.

8. A non-volatile semiconductor memory device comprising:
a cell array having electrically rewritable and non-volatile memory cells arranged therein;
a sense amplifier circuit configured to detect voltage change of a bit line in said cell array, thereby reading data of a selected memory cell coupled to the bit line: and
a controller configured to force said sense amplifier circuit to read data at three timings within a period in which the bit line voltage is changing in correspondence with said selected memory cell, and compare data read out by successive two data read operations with each other so as to judge a threshold margin of said selected memory cell.

9. The non-volatile semiconductor memory device according to claim 8, wherein
said sense amplifier circuit comprises a plurality of sense units connected to different bit lines in said cell array, each said sense unit comprising:
a first transistor disposed to selectively connect a sense node to a bit line of said cell array for clamping bit line voltage and transferring bit line voltage to the sense node;
a second transistor coupled to the sense node to serve for precharging the sense node and bit line;
a data latch configured to detect the bit line voltage to latch a read data;
a data storage circuit configured to temporarily store the read data transferred from said data latch; and
a threshold margin judgment circuit configured to compare a first read data stored in said data storage circuit with a second read data read out later than the first read data to be latched in said data latch so as to output a warning signal in case data inversion is detected between the first and second read data.

10. The non-volatile semiconductor memory device according to claim 9, further comprising a common signal line shared with said plurality of sense units, on which the warning signal is output in case at least one bit is detected as being an insufficient threshold margin state within the entire read data bits in said sense amplifier circuit.

11. The non-volatile semiconductor memory device according to claim 9, wherein
said threshold margin judgment circuit comprises a logic gate configured to detect that the first and second read data are inverted in logic to output a warning signal.

12. The non-volatile semiconductor memory device according to claim 9, further comprising an ECC circuit controlled to do error-checking and correcting for read data only when the warning signal is output.

13. The non-volatile semiconductor memory device according to claim 12, wherein
said controller has a page copy function that reads a page data of said cell array and write it into another page, and wherein
said ECC circuit is controlled to do error-checking and correcting for read data of a copy source page only when the warning signal is output.

14. The non-volatile semiconductor memory device according to claim 8, wherein
said cell array comprises a plurality of NAND cell units arranged therein, each NAND cell unit having memory cells connected in series with control gates coupled to different word lines, respectively, a first select gate transistor disposed to couple one end of said memory cells connected in series to a bit line, and a second select gate transistor disposed to couple the other end to a common source line, and wherein
said cell array has a plurality of blocks arranged in the direction of a bit line, each block being defined as a group of NAND cell units with a shared word line.

15. An electric card equipped with a non-volatile semiconductor memory device defined in claim 8.

16. An electric device comprising:
a card interface;
a card slot connected to said card interface; and
an electric card defined in claim 15 and electrically connectable to said card slot.

* * * * *